United States Patent
Yang et al.

(10) Patent No.: US 10,944,011 B2
(45) Date of Patent: Mar. 9, 2021

(54) DISPLAY APPARATUS AND METHOD OF MANUFACTURING THE SAME

(71) Applicant: SAMSUNG DISPLAY CO., LTD., Yongin-si (KR)

(72) Inventors: Tae Hoon Yang, Yongin-si (KR); Kibum Kim, Yongin-si (KR); Jongjun Baek, Yongin-si (KR); Byung Soo So, Yongin-si (KR); Jong chan Lee, Yongin-si (KR); Woong Hee Jeong, Yongin-si (KR); Jaewoo Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/594,284

(22) Filed: Oct. 7, 2019

(65) Prior Publication Data
US 2020/0168743 A1 May 28, 2020

(30) Foreign Application Priority Data
Nov. 22, 2018 (KR) .......................... 10-2018-0145248

(51) Int. Cl.
*H01L 27/12* (2006.01)
*H01L 29/786* (2006.01)

(52) U.S. Cl.
CPC .... *H01L 29/78621* (2013.01); *H01L 27/1222* (2013.01); *H01L 27/1248* (2013.01); *H01L 27/1274* (2013.01); *H01L 29/78696* (2013.01)

(58) Field of Classification Search
CPC ......... H01L 27/14616; H01L 27/14609; H01L 27/1274
See application file for complete search history.

(56) References Cited

U.S. PATENT DOCUMENTS

| | | | | |
|---|---|---|---|---|
| 4,803,533 A | * | 2/1989 | Chang ................. | H01L 21/2253 257/345 |
| 5,463,237 A | * | 10/1995 | Funaki ................. | H01L 29/105 257/336 |

(Continued)

FOREIGN PATENT DOCUMENTS

KR 10-0811997 B1 3/2008

OTHER PUBLICATIONS

Lin et al. "Origin of Hyseresis in current-voltage characteristics of polycrystalline silicon thin-film transistors", AIP Journal of Applied Physics 105, 2009.

(Continued)

*Primary Examiner* — William A Harriston
(74) *Attorney, Agent, or Firm* — Kile Park Reed & Houtteman PLLC (57) ABSTRACT

A display apparatus includes a base substrate, an active pattern on the base substrate including a source region, a drain region, and a channel region that is doped between the source region and the drain region, the channel region including polycrystalline silicon, and a gate electrode overlapping the channel region of the active pattern. The channel region may include a lower portion, an upper portion, and an intermediate portion between the upper portion and the lower portion, and a dopant density of the lower portion may be 80% or more of a dopant density of the upper portion.

19 Claims, 11 Drawing Sheets

(56) References Cited

U.S. PATENT DOCUMENTS

| | | | | |
|---|---|---|---|---|
| 5,548,143 | A * | 8/1996 | Lee | H01L 29/1033 257/269 |
| 5,847,411 | A * | 12/1998 | Morii | H01L 21/3003 257/64 |
| 6,162,693 | A * | 12/2000 | Wang | H01L 21/2652 438/303 |
| 6,320,202 | B1 * | 11/2001 | Banerjee | H01L 21/2022 257/65 |
| 6,323,520 | B1 * | 11/2001 | Saha | H01L 21/26513 257/345 |
| 6,426,279 | B1 * | 7/2002 | Huster | H01L 29/105 438/528 |
| 6,566,696 | B1 * | 5/2003 | Cheek | H01L 29/105 257/269 |
| 6,639,246 | B2 * | 10/2003 | Honda | H01L 29/6675 257/347 |
| 6,872,640 | B1 * | 3/2005 | Mouli | H01L 27/1203 257/347 |
| 6,960,499 | B2 * | 11/2005 | Nandakumar | H01L 21/2652 438/197 |
| 7,825,476 | B2 * | 11/2010 | Yang | H01L 21/02488 257/359 |
| 8,803,233 | B2 * | 8/2014 | Cheng | H01L 27/0922 257/335 |
| 10,134,914 | B2 * | 11/2018 | Yamazaki | H01L 29/786 |
| 2003/0020065 | A1 * | 1/2003 | Honda | H01L 29/78645 257/67 |
| 2003/0183270 | A1 * | 10/2003 | Falk | H01L 31/1872 136/258 |
| 2005/0151202 | A1 * | 7/2005 | Wieczorek | H01L 21/823807 257/369 |
| 2005/0181566 | A1 * | 8/2005 | Machida | H01L 29/66757 438/301 |
| 2006/0138548 | A1 * | 6/2006 | Richards, Jr. | H01L 21/28255 257/368 |
| 2007/0166922 | A1 * | 7/2007 | Surdeanu | H01L 29/42384 438/262 |
| 2009/0250693 | A1 * | 10/2009 | Jeong | H01L 29/7869 257/43 |
| 2013/0113041 | A1 * | 5/2013 | Liu | H01L 29/1054 257/335 |
| 2014/0008647 | A1 * | 1/2014 | Yamazaki | H01L 29/24 257/43 |
| 2014/0103429 | A1 * | 4/2014 | Chuang | H01L 29/66681 257/335 |
| 2014/0113405 | A1 * | 4/2014 | Tsubuku | H01L 21/02483 438/104 |
| 2014/0191290 | A1 * | 7/2014 | Funao | H01L 27/14643 257/231 |
| 2015/0008482 | A1 * | 1/2015 | Sato | H01L 27/14643 257/183.1 |
| 2015/0191847 | A1 * | 7/2015 | Benaissa | C30B 13/24 117/43 |
| 2016/0049517 | A1 * | 2/2016 | Lee | H01L 29/7869 257/43 |
| 2016/0172444 | A1 * | 6/2016 | Bakhishev | H01L 29/105 438/290 |
| 2016/0181370 | A1 * | 6/2016 | Shifren | H01L 29/0847 257/369 |
| 2017/0263783 | A1 * | 9/2017 | Yamazaki | H01L 29/78696 |
| 2019/0058039 | A1 * | 2/2019 | Cai | H01L 29/0878 |

OTHER PUBLICATIONS

Hackenberg et al. "Modeling boron profiles in silicon after pulsed excimer laser annealing", AIP Conference Proceedings, 1496, 2012.

* cited by examiner

DISPLAY APPARATUS AND METHOD OF MANUFACTURING THE SAME

CROSS-REFERENCE TO RELATED APPLICATION

Korean Patent Application No. 10-2018-0145248, filed on Nov. 22, 2018, in the Korean Intellectual Property Office, and entitled: "Display Apparatus and Method of Manufacturing the Same," is incorporated by reference herein in its entirety.

BACKGROUND

1. Field

Example embodiments relate to a display apparatus and a method of manufacturing the display apparatus.

2. Description of the Related Art

Recently, a display apparatus having light weight and small size has been manufactured. A cathode ray tube (CRT) display apparatus has been used due to a performance and a competitive price. However, the CRT display apparatus has a weakness with a size or portability. Therefore, a display apparatus such as a plasma display apparatus, a liquid crystal display apparatus, and an organic light emitting display apparatus has been highly regarded due to small size, light weight, and low-power-consumption.

SUMMARY

Embodiments are directed to a display apparatus, including a base substrate, an active pattern on the base substrate including a source region, a drain region, and a channel region that is doped between the source region and the drain region, the channel region including polycrystalline silicon, and a gate electrode overlapping the channel region of the active pattern. The channel region may include a lower portion, an upper portion, and an intermediate portion between the upper portion and the lower portion, and a dopant density of the lower portion may be 80% or more of a dopant density of the upper portion.

The upper portion may be ⅓ thickness of the active pattern, and the lower portion may be ⅓ thickness of the active pattern.

A dopant of the channel region of the active pattern may include one or more of boron, phosphorus, nitrogen, nickel, or cobalt.

An average grain size of the channel region of the active pattern may be 270 nm or more.

A fraction of (001) direction may be 33% or more according to an Electron Back-Scattering Diffraction result of the channel region of the active pattern.

The display apparatus may further include a gate insulating layer between the active pattern and the gate electrode, an interlayer insulating layer on the gate electrode, and source and drain electrodes on the interlayer insulating layer, and electrically connected to the active pattern.

The display apparatus may further include a via insulating layer on the source and drain electrodes, a first electrode on the via insulating layer, and electrically connected to the drain electrode, a light emitting layer on the first electrode, and a second electrode on the light emitting layer.

Embodiments are also directed to a method of manufacturing a display apparatus, the method including forming an amorphous silicon layer on a base substrate, doping the amorphous silicon layer with impurities, forming a polycrystalline silicon layer by irradiating the amorphous silicon layer, which is doped, with an excimer laser, patterning the crystalline silicon layer, and forming a source region and a drain region in the crystalline silicon layer to form an active pattern including the source region, the drain region, and a channel region between the source region and the drain region. The channel region may include a lower portion, an upper portion, and an intermediate portion between the upper portion and the lower portion, and a dopant density of the lower portion may be 80% or more of a dopant density of the upper portion.

In doping the amorphous silicon layer, a dopant of the channel region of the active pattern may include one or more of boron, phosphorus, nitrogen, nickel, or cobalt.

In doping the amorphous silicon layer, a dose amount of the dopant may be 0.4E12 to 1.5E12 at/cm$^2$.

The crystalline silicon layer may satisfy the following Equation 1:

$$Y = -0.075X + 1.018 \text{ nm} \qquad \text{<Equation 1>}$$

where Y is a depth from an upper surface of the crystalline silicon layer at a max peak of the dopant amount, in nanometers, and X is laser density of the excimer laser in J/cm$^2$.

In forming the active pattern, the source region and the drain region of the crystalline silicon layer, which is doped, may be further doped with impurities to increase conductivity of the source region and the drain region.

A dose amount for forming the source region and the drain region in forming the active pattern may be greater than a dose amount in the doping of the amorphous silicon layer.

An average grain size of the channel region of the active pattern may be 270 nm or more.

A fraction of (001) direction may be 33% or more according to an Electron Back-Scattering Diffraction result of the channel region of the active pattern.

The method may further include forming a gate insulating layer on the crystalline silicon layer which is patterned after pattering the crystalline silicon layer, and forming a gate electrode on the gate insulating layer. In forming the active pattern, impurities may be doped into the crystalline silicon layer where the gate electrode is disposed to form the source region and the drain region.

The method may further include forming an intermediate insulating layer on the gate electrode, forming a source electrode and a drain electrode electrically connected to the active pattern on the intermediate insulating layer, forming a via insulating layer on the source electrode and the drain electrode, forming a first electrode electrically connected to the drain electrode on the via insulating layer, forming a light emitting layer on the first electrode, and forming a second electrode on the light emitting layer.

The may further include performing heat treatment on the active pattern.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 1:
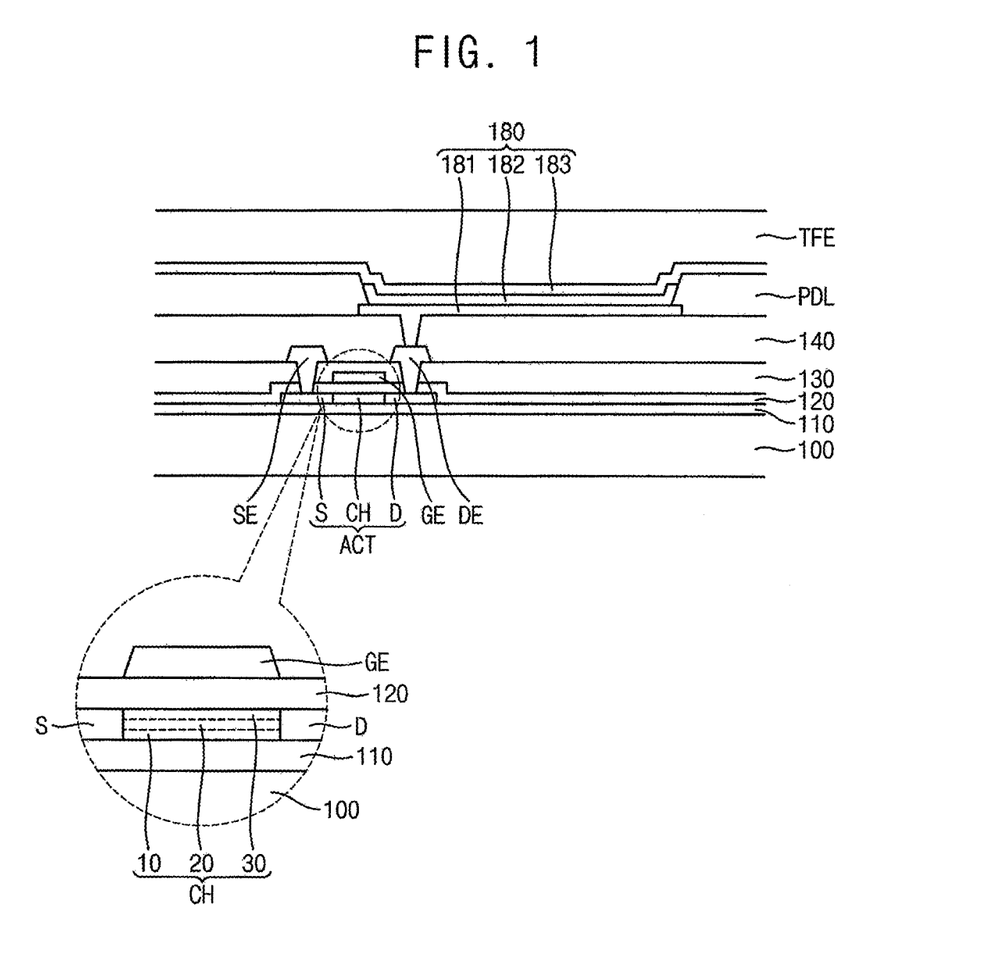
FIG. 1 illustrates a cross-sectional view of a display apparatus according to an example embodiment.

FIG. 1 is across-sectional view illustrating a display apparatus according to an example embodiment.

Referring to FIG. 1, the display apparatus may include a base substrate 100, a buffer layer 110, an active pattern ACT, a gate insulating layer 120, a gate electrode GE, an interlayer insulating layer 130, a source electrode SE, a via insulating layer 140, a light emitting structure 180, a pixel definition layer PDL, and a thin-film encapsulation layer TFE.

The base substrate 100 may include transparent or opaque insulation materials. For example, the base substrate 100 may include a quartz substrate, a synthetic quartz substrate, a calcium fluoride substrate, a fluoride-doped quartz substrate, a soda lime glass substrate, a non-alkali glass substrate etc. In another implementation, the base substrate 100 may include a flexible transparent material such as a flexible transparent resin substrate, e.g., a polyimide substrate. In this case, the polyimide substrate may include a first polyimide layer, a barrier film layer, a second polyimide layer, etc. For example, the polyimide substrate may have a configuration where the first polyimide layer, the barrier film layer, and the second polyimide layer, are stacked on the rigid glass substrate.

The buffer layer 110 may be disposed on the base substrate 100. The buffer layer 110 may be disposed on the entire base substrate 100. The buffer layer 110 may prevent the diffusion of metal atoms and/or impurities from the substrate 100 into the active pattern ACT. In addition, the buffer layer 110 may control a rate of a heat transfer in a crystallization process for forming the active pattern ACT, which may help provide a substantially uniform active pattern ACT. In addition, the buffer layer 110 may improve flatness of a surface of the base substrate 100 when the surface of the base substrate 100 is not uniform.

The active pattern ACT may be disposed on the buffer layer 110. The active pattern ACT may include polycrystalline silicon. The active pattern ACT may include drain and source regions D and S doped with an impurity, and a channel region C between the drain region D and the source region S.

Impurities may also be doped in the channel region CH (channel doping), and the impurities may include at least one of boron (B), phosphorus (P), nitrogen (N), nickel (Ni), cobalt (Co), and fluorine (F). In the present example embodiment, the case where the impurity is boron is exemplified. The channel region CH may include a lower portion 10 adjacent to the buffer layer 110, an upper portion 30 adjacent to the gate insulating layer 120, and an intermediate portion 20 between the lower portion 10 and the upper portion 30.

When the dopant is boron, the density of the dopant may not rapidly change according to a depth from the top surface of the active pattern ACT, but may change relatively slowly. Thus, the dopant may be evenly distributed throughout the channel region CH of the active pattern ACT.

In the present example embodiment, the dopant density of the lower portion 10 may be 80% or more of the dopant density of the upper portion 30. A thickness of the upper portion 30 may be about ⅓ of a total thickness of the active pattern ACT. A thickness of the lower portion 10 may be about ⅓ of the total thickness of the active pattern ACT.

In general, in a channel region of an active pattern in which channel doping is performed, dopant density is intensively disposed adjacent to a surface of the active pattern, which is an upper surface of the active pattern, and the dopant density is rapidly decreased as closer to a lower surface of the active pattern.

On the other hand, according to the present example embodiment, the dopant of the channel region CH is substantially evenly distributed from the upper surface to the lower surface of the active pattern ACT according to the pre-doping, which will be described below. Therefore, even with a small amount of channel doping, sufficient positive shift of Vth may be obtained, driving range (DR range) may be increased, and subthreshold swing (SS) and drain-induced barrier lowering (DIBL) may be reduced.

The gate insulating layer 120 may cover the active pattern ACT on the buffer layer 110 and may be disposed to have substantially the same thickness along the profile of the active pattern ACT. The gate insulating layer 120 may include an inorganic insulating material such as a silicon compound or a metal oxide.

The gate electrode GE may be disposed on the gate insulating layer 120 to overlap the channel region CH of the active pattern ACT. The gate electrode GE may be formed using a metal, an alloy, a metal nitride, a conductive metal oxide, a transparent conductive material, or the like.

The interlayer insulating layer 130 may be disposed on the gate insulating layer 120 on which the gate electrode GE is disposed. The interlayer insulating layer 130 may sufficiently cover the gate electrode GE on the gate insulating layer 120 and may have a substantially flat upper surface without forming a step around the gate electrode GE. The interlayer insulating layer 140 may include an inorganic insulating material such as a silicon compound or a metal oxide.

A source electrode SE and a drain electrode DE may be disposed on the interlayer insulating layer 120. The source electrode SE and the drain electrode DE may be connected to the source region S and the drain region D of the thin film transistor TFT through contact holes formed through the interlayer insulating layer 130 and the gate insulating layer 120, respectively. The characteristics of the thin film transistor TFT will be described in detail with reference to FIGS. 2 to 5.

The active pattern ACT, the gate electrode GE, the source electrode SE, and the drain electrode DE may be included in a thin film transistor TFT. The thin film transistor TFT may be a driving transistor that provides a driving current to an organic light emitting diode (OLED) as a light emitting structure.

The via insulating layer 140 may be disposed on the interlayer insulating layer 130 on which the source electrode SE and the drain electrode DE are disposed. The via insulating layer 140 may have a single-layer structure, or may have a multi-layer structure including at least two insulating layers. The via insulating layer 140 may be formed using an organic material such as a photoresist, an acrylic resin, a polyimide resin, a polyamide resin, or a siloxane-based resin.

The light emitting structure 180 may include a first electrode 181, an emission layer 182, and a second electrode 183.

The first electrode 181 may be disposed on the via insulation layer 140. The first electrode 181 may include a reflective material or a transmissive material in accordance with the emission type of the display apparatus. In an example embodiment, the first electrode 181 may have a single layer structure or a multi-layer structure, which may include a metal film, an alloy film, a metal nitride film, a conductive metal oxide film, and/or a transparent conductive film.

The pixel defining layer PDL may be disposed on the via insulation layer 140 on which the first electrode 181 is disposed. The pixel defining layer PDL may be formed using an organic material. For example, the pixel defining layer PDL may include photoresist, acryl-based resin, polyimide-based resin, polyamide-based resin, siloxane-based resin, etc. In an example embodiment, an opening which exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to an emitting area, and a non-emitting area may correspond to a portion adjacent to the opening of the pixel defining layer PDL.

The light emitting layer 182 may be disposed on the first electrode 181 exposed through the opening of the pixel defining layer PDL. In addition, the light emitting layer 182 may extend on a sidewall of the opening of the pixel defining layer PDL. In an example embodiment, the light emitting layer 182 may include an organic light emitting layer (EL), a hole injection layer (HIL), a hole transfer layer (HTL), an electron transfer layer (ETL), an electron injection layer (EIL), etc. In an example embodiment, except for the organic emission layer, the hole injection layer, the hole transport layer, the electron transport layer, and the electron injection layer may be formed in common to correspond to a plurality of pixels. In an example embodiment, a plurality of organic light emitting layers may be formed using light emitting materials for generating different colors of light such as a red color of light, a green color of light, and a blue color of light in accordance with color pixels of the display device. In an example embodiment, the organic light emitting layer of the of the light emitting layer 182 may include a plurality of stacked light emitting materials for generating a red color of light, a green color of light, and a blue color of light to thereby emitting a white color of light. Here, elements of the light emitting layer 182 may be commonly formed so as to correspond to a plurality of pixels, and each pixel may be divided by a color filter layer.

The second electrode 183 may be disposed on the pixel defining layer PDL and the light emitting layer 182. The second electrode 183 may include a transmissive material or a reflective material in accordance with the emission type of the display device. In an example embodiment, the second electrode 183 may also have a single layer structure or a multi-layer structure, which may include a metal film, an alloy film, a metal nitride film, a conductive metal oxide film, and/or a transparent conductive film.

The thin film encapsulation layer TFE may be disposed on the second electrode 183. The thin film encapsulation layer TFE may prevent penetration of moisture and oxygen from outside. The thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer therebetween. In an example embodiment, it may be possible to provide a sealing substrate for shielding outside air and moisture from penetrating into the display apparatus instead of the thin film encapsulation layer TFE.

Figure 2:
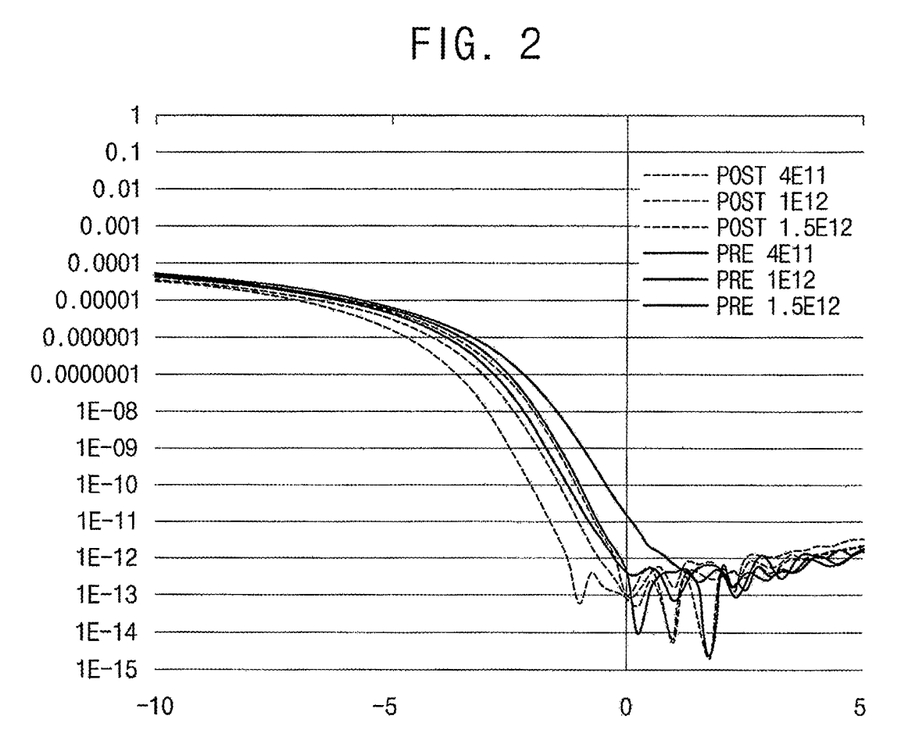
FIG. 2 illustrates a graph showing I-V curves of a thin film transistor according to a channel doping order and a channel doping amount.

FIG. 2 is a cross-sectional view illustrating a display apparatus according to an example embodiment.

A horizontal axis in the drawing is a gate voltage (Vgs) which is input to the gate electrode of the thin-film transistor, and a vertical axis is a source-drain current (Ids) flowing in the channel region of the thin-film transistor.

As shown in the drawing, the source drain current Ids flowing through the thin film transistor is proportional to its magnitude in a region where the gate voltage Vgs is negative. Thus, by controlling the gate voltage Vgs, a current input to a first electrode or a current input to the organic light emitting diode from a power line can be controlled, and consequently, the display of the image can be controlled.

In FIG. 2, the I-V curve of the thin film transistor is shown in six cases. Vth (threshold voltage) is shifted to a positive direction (right side) rather than post-crystallization (POST, post-doping) when amorphous silicon is doped and then crystallized (PRE, pre-doping). It can be seen that Vth shifts to a positive direction (right side) as dose amount of the impurity increases (4E11, 1E12, 1.5E12).

Further, in the case of pre-doping, the slope of the IV curve becomes gentler and the driving range (DR) becomes wider than in the case of post-doping, so that it is suitable as a driving transistor of the organic light emitting display apparatus.

When a thin film transistor exhibits hysteresis, the hysteresis may cause a residual image (ghost) of an image. When a thin film transistor exhibits hysteresis, a curve measuring the source drain current Igs while changing the gate voltage Vgs from a low voltage to a high voltage and a curve measuring the source drain current Igs while changing the gate voltage Vgs from the high voltage to the low voltage do not coincide each other.

In this case, when the gray screen is displayed, the value of the source-drain current (Igs) while the gate-source voltage (Vgs) changes from a low voltage to a high voltage is greater than the value of the value (IC) of the source-drain current (Igs) while the gate-source voltage (Vgs) changes from the high voltage to the low voltage. Accordingly, display quality problems such as the residual image may be caused according to a display image of a previous frame.

For example, when a black/white pattern is applied for 10 seconds and then a 48 gray (low gray) pattern is applied, a luminance difference occurs, and the luminance difference decreases with time. At this time, degree of the residual image (unit: second) can be confirmed by measuring the time at which the luminance difference reaches 0.4%.

Figure 3A:
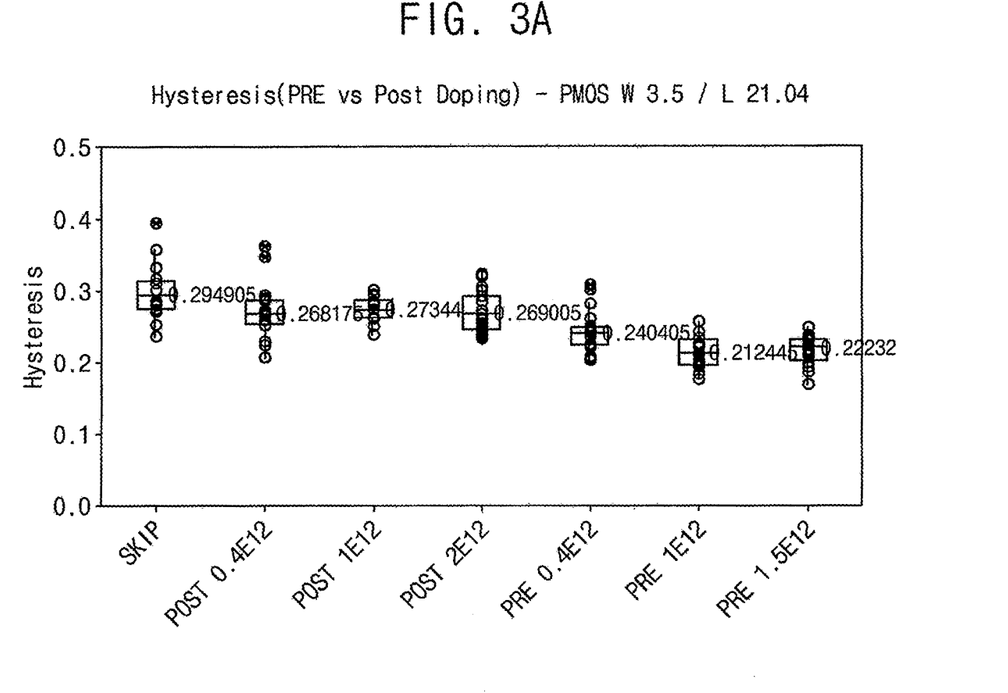
FIGS. 3A and 3B illustrate graphs showing hysteresis of a thin film transistor according to a channel doping order and a channel doping amount.
Figure 3B:
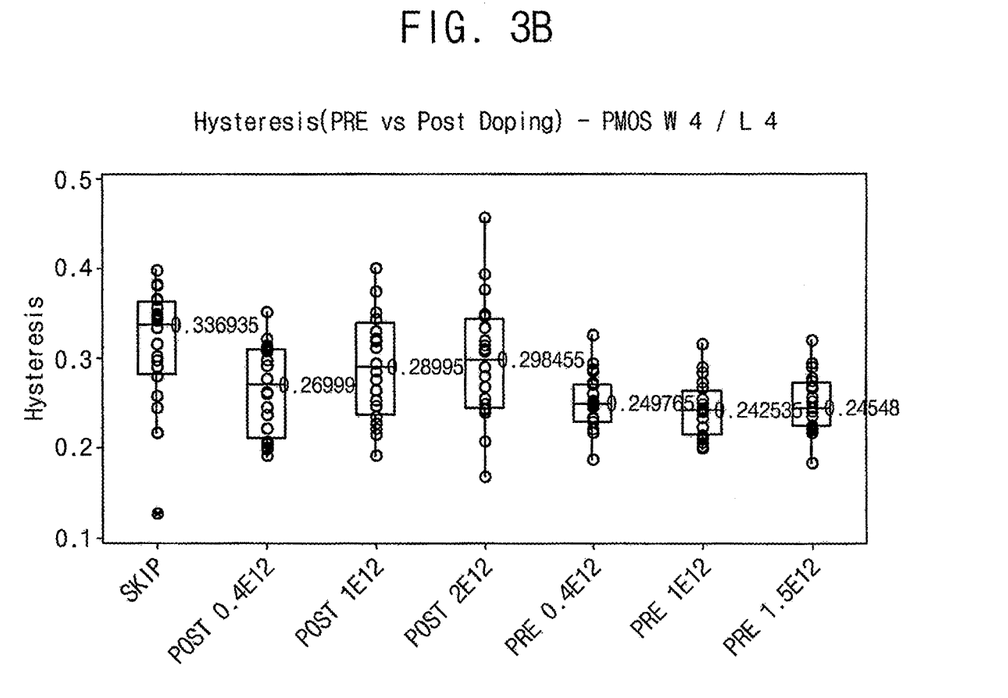

FIGS. 3A and 3B are graphs showing hysteresis of a thin film transistor according to a channel doping order and a channel doping amount.

FIGS. 3A and 3B show measured hysteresis (unit: V (voltage)) according to changes of the dose amount (0.4E12, 1E12, 2E12) in cases where the channel region of the thin film transistor is not doped (SKIP), and the case of pre-doping (PRE, i.e., doping before an excimer laser annealing (ELA) process) and post-doping (POST, i.e., doping after an excimer laser annealing (ELA) process).

FIG. 3A shows a case where the thin film transistor is a PMOS transistor having a channel width of 4 μm (micrometer) and a length of 21.04 μm. FIG. 3B shows a case where the thin film transistor is a PMOS transistor having a channel width of 4 μm and a length of 4 μm. In either case, it can be seen that pre-doping reduces hysteresis compared to post-doping of the same dose amount or SKIP.

Specifically, in the case of the pre-doping with a dose of 0.4E12 as compared with the post-doping case (POST1E12) having a dose amount of 1E12 in FIG. 3A, the posi-shift effect of Vth is maximized while the dose amount is decreased, and the hysteresis decreases.

In addition, the hysteresis can be reduced to improve the residual image, which can be confirmed by the following Table 1.

TABLE 1

| Doping order | Acceleration voltage | Dose amount | Vth | Hysteresis (V) | Instant residual image (second) |
|---|---|---|---|---|---|
| Post-doping | 10K | 1.3E12 | −3.23 | 0.219 | 8.6 |
| Pre-doping | 15K | 1.5E12 | −3 | 0.187 | 7.0 |

Figure 4:
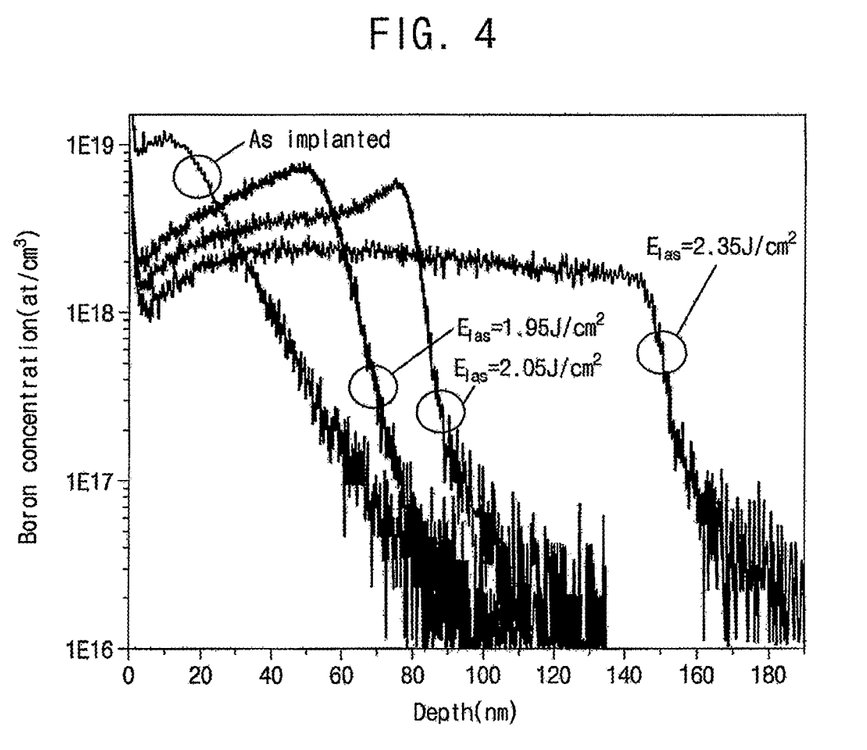
FIG. 4 illustrates a graph showing changes of dopant density depending on a depth of an active pattern according to a laser energy of an excimer laser annealing (ELA) process.

FIG. 4 is a graph showing changes of dopant density depending on a depth of an active pattern according to a laser energy of an excimer laser annealing (ELA) process.

Referring to FIG. 4, the horizontal axis represents a depth from an upper surface of the active pattern, and the vertical axis represents a density of boron (B) as a dopant.

As shown, the boron dopant is diffused to a lower portion of the active pattern according to the ELA process. Thus, the boron is mainly distributed in an upper portion of the active pattern in an initially doped state, but the boron diffuses to the lower portion of the active pattern according to the ELA process.

At this time, as the laser energy of the ELA process becomes higher (i.e., as implanted: doped state→1.95 J/cm²→2.05 J/cm²→2.35 J/cm²), diffusion is better, and the peak of density of the boron (dopant max peak) becomes deeper.

When this is formulated, the result in the following [Equation 1] can be obtained.

$$Y = -0.075X + 1.018 \text{ nm} \qquad [\text{Equation 1}]$$

where Y is a depth from an upper surface of the crystalline silicon layer at a max peak of the dopant amount, in nanometers, and X is laser density of the excimer laser in J/cm².

The constants of the above equation may vary depending on the properties of the thin film and the characteristics of the equipment.

Figure 5:
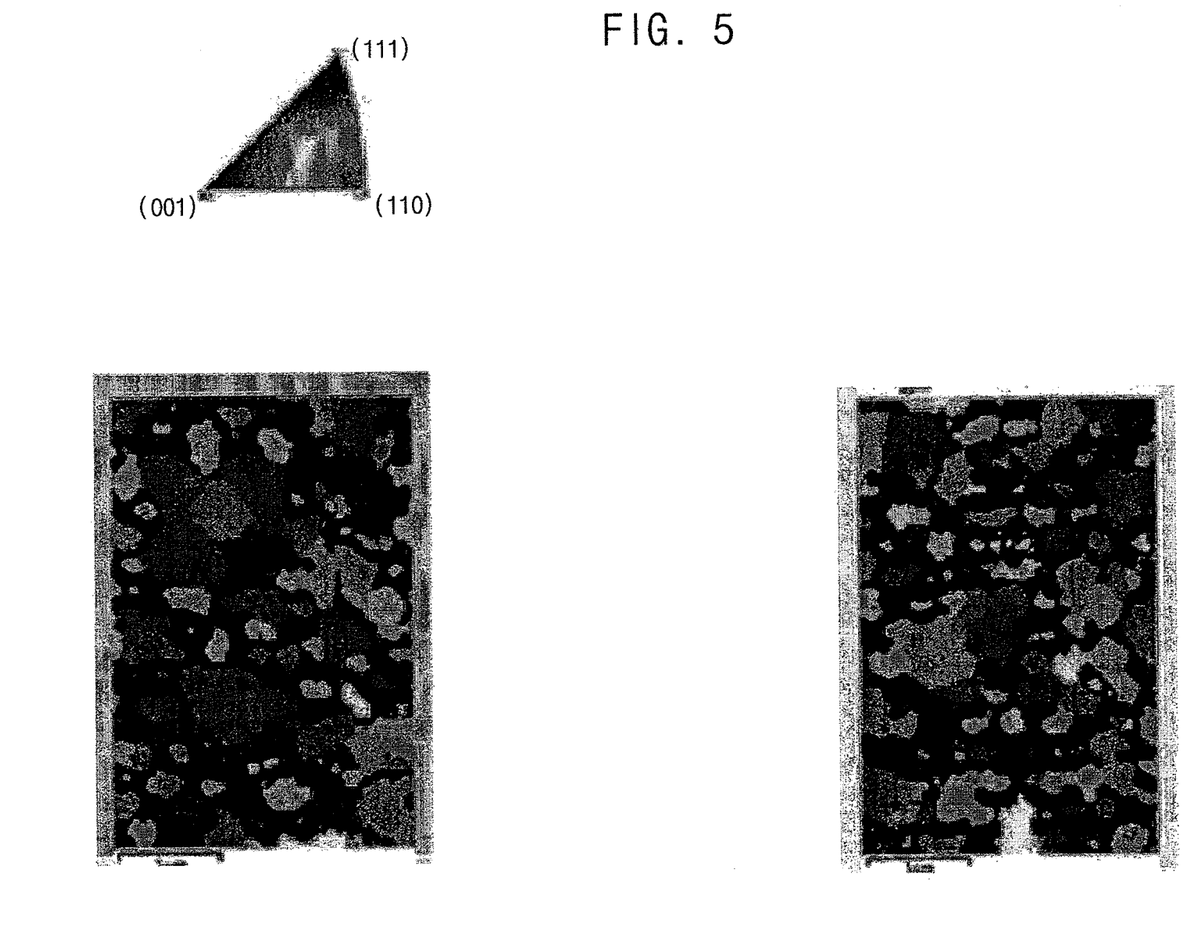
FIG. 5 illustrates a diagram showing an EBSD (Electron Back-Scattering Diffraction) result according to a channel doping order.

FIG. 5 is a diagram showing an EBSD (Electron Back-Scattering Diffraction) result according to a channel doping order.

Referring to FIG. 5, a color code standard triangle according to Electron Backs-scattering Diffraction (EBSD), a surface orientation image in a case of post-doping (b), and a surface orientation image in a case of pre-doping (a) are shown. EBSD is a known method of measuring a statistical distribution of grain in a sample with a Kikuchi diffraction pattern.

Table 2 below shows an average grain size measured in accordance with EBSD and a fraction of (001) direction in the case of pre-doping and post-doping, respectively.

TABLE 2

| | Average grain size (nm) | (001) Fraction (%) |
|---|---|---|
| Pre-doping | 285 | 36.5 |
| Post-doping | 256 | 30.7 |

In the case of pre-doping, it can be confirmed that the fraction of (001) direction is increased by 10 to 30% as compared with the case of post-doping.

FIGS. 6A to 6H are cross-sectional views illustrating a method of manufacturing a display apparatus according to an example embodiment.

Figure 6A:
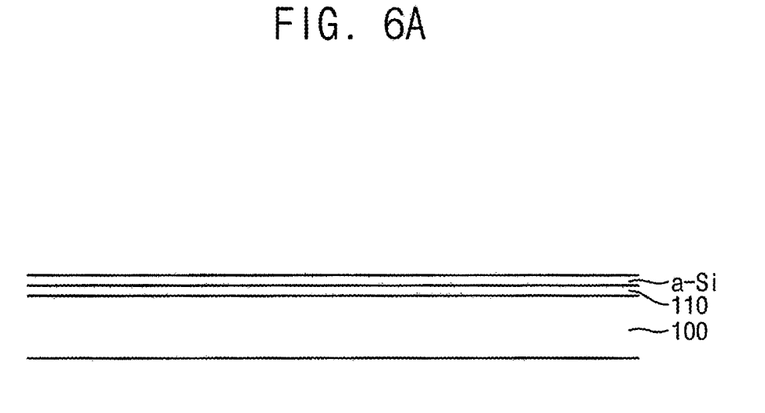
FIGS. 6A to 6H illustrate cross-sectional views of a method of manufacturing a display apparatus according to an example embodiment.

Referring to FIG. 6A, a buffer layer 110 may be formed on the base substrate 100. An amorphous silicon layer (a-Si layer) may be formed on the buffer layer 110.

Figure 6B:
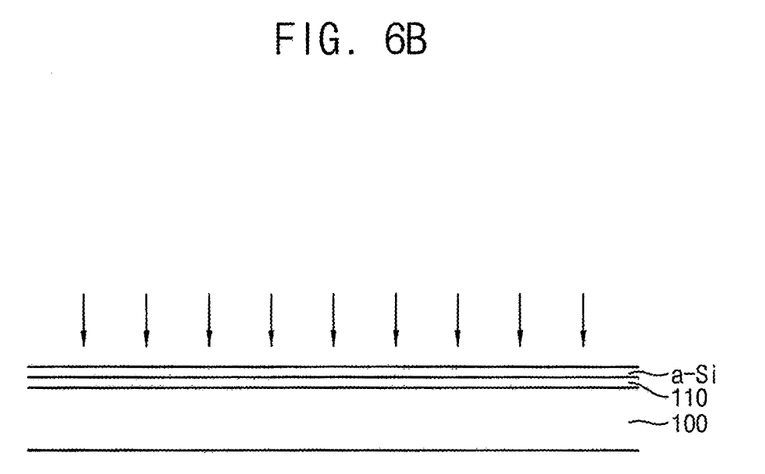

Referring to FIG. 6B, doping process may be performed by providing impurities on the amorphous silicon layer (a-Si layer). The impurity, which is a dopant, may be any one of boron (B), phosphorus (P), nitrogen (N), nickel (Ni), cobalt (Co), or fluorine (F). The doping process may be performed by implanter, shower, CVD, sputter, or the like.

At this time, dose amount of the dopant may be 0.4E12 to 1.5E12 at/cm². When the dose amount is too large, the hysteresis may decrease, but the Vth shift amount may deviate from a desired range, and a dispersion may become unsuitably large. On the other hand, when the dose amount is too small, a desired effect may not be obtained.

Figure 6C:
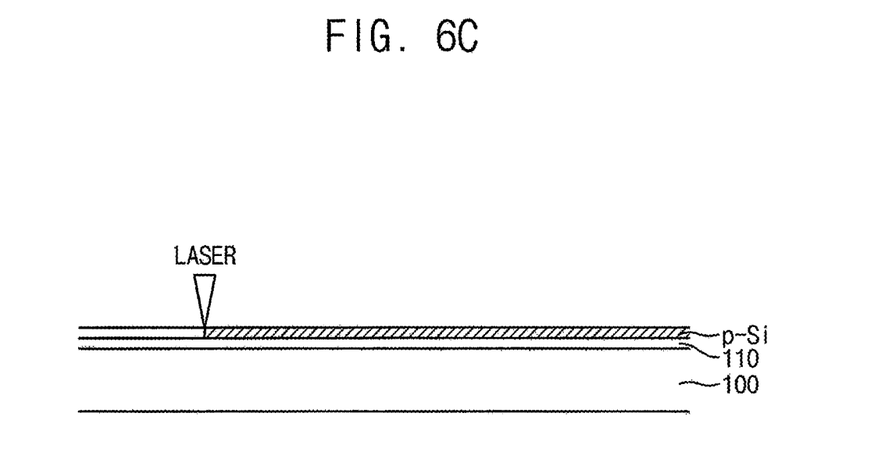

Referring to FIG. 6C, a crystalline silicon layer, e.g., a polycrystalline layer (p-Si layer) may be formed by irradiating the doped amorphous silicon layer with an excimer laser (ELA).

At this time, a laser energy of the excimer laser may be in an appropriate range. When the laser energy is too low, the dopant may not sufficiently diffuse, and when the laser energy is too high, it may be difficult to obtain the desired thin film transistor characteristics.

Figure 6D:
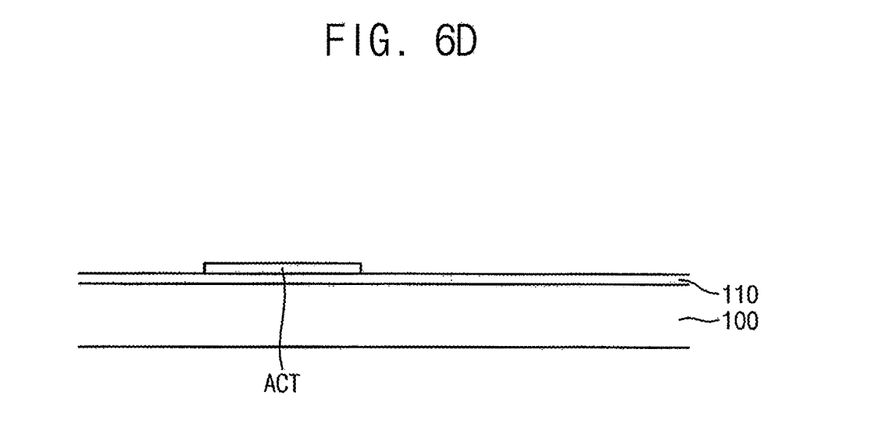

Referring to FIG. 6D, the polycrystalline silicon layer (p-Si layer) may be patterned into an active pattern ACT. For example, the polycrystalline silicon layer (p-Si layer) may be patterned through a photolithography process or the like. At this time, the active pattern ACT may be in a state in which the source region and the drain region are not formed and only channel doping is performed.

Figure 6E:
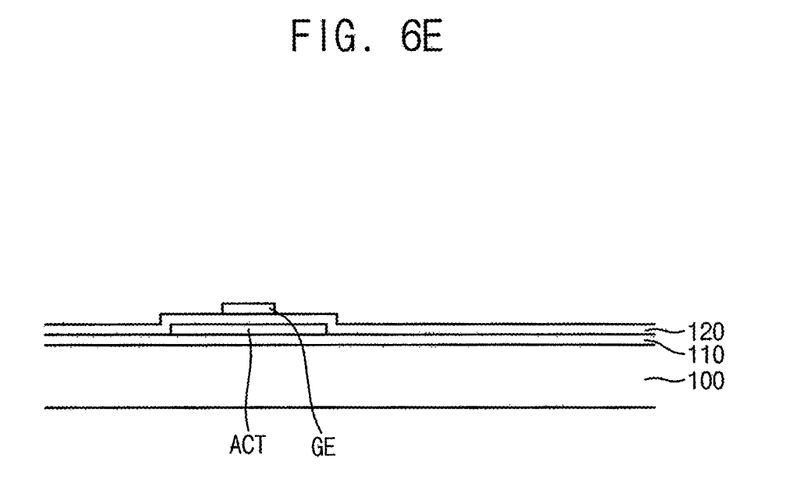

Referring to FIG. 6E, the gate insulating layer 120 may be formed on the active pattern ACT. A gate electrode GE may be formed on the gate insulating layer 120 so as to overlap with the active pattern ACT.

Figure 6F:
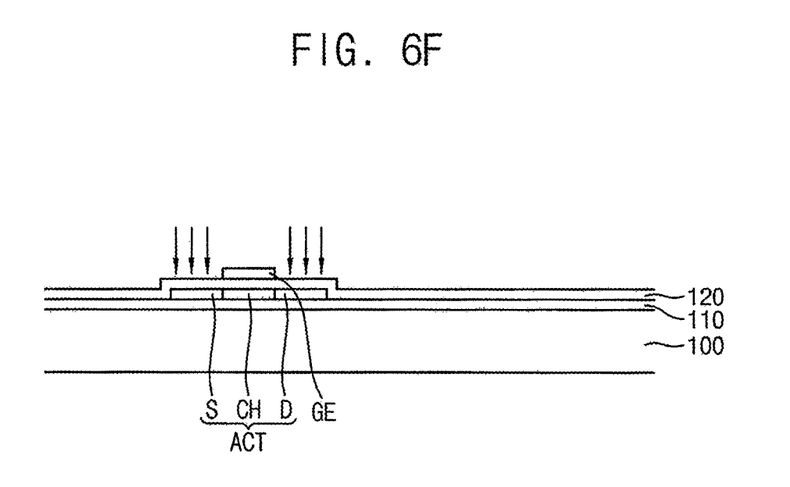

Referring to FIG. 6F, the source region S and the drain region D of the active pattern ACT may be formed by doping impurities into the active pattern ACT on which the gate electrode GE is formed. Accordingly, a channel region CH between the source region S and the drain region D may be formed to overlap with the gate electrode GE.

Thereafter, a heat treatment may be performed to the active pattern ACT for activation and curing of the active pattern ACT.

Figure 6G:
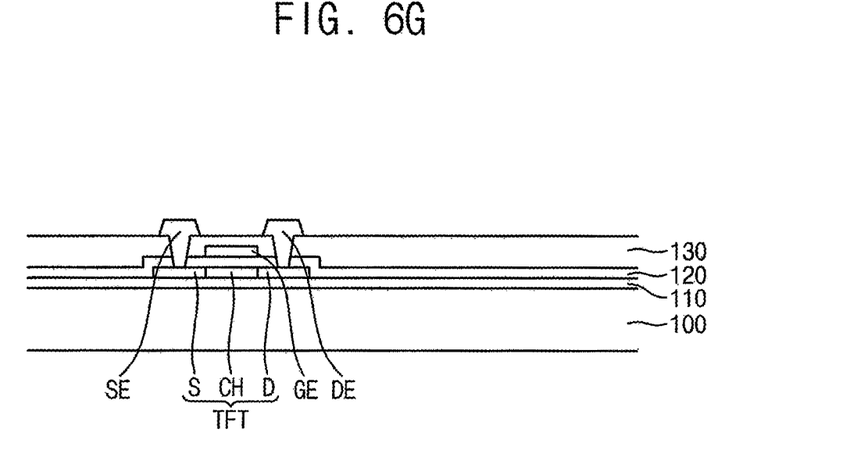

Referring to FIG. 6G, an interlayer insulating layer 130 may be formed on the gate insulating layer 120 on which the gate electrode GE is disposed. A portion of the interlayer insulating layer 120 may be removed to form contact holes exposing the source region S and the drain region D of the active pattern ACT. A source electrode SE and a drain electrode DE may be formed on the interlayer insulating layer 130 on which the contact holes are formed.

Figure 6H:
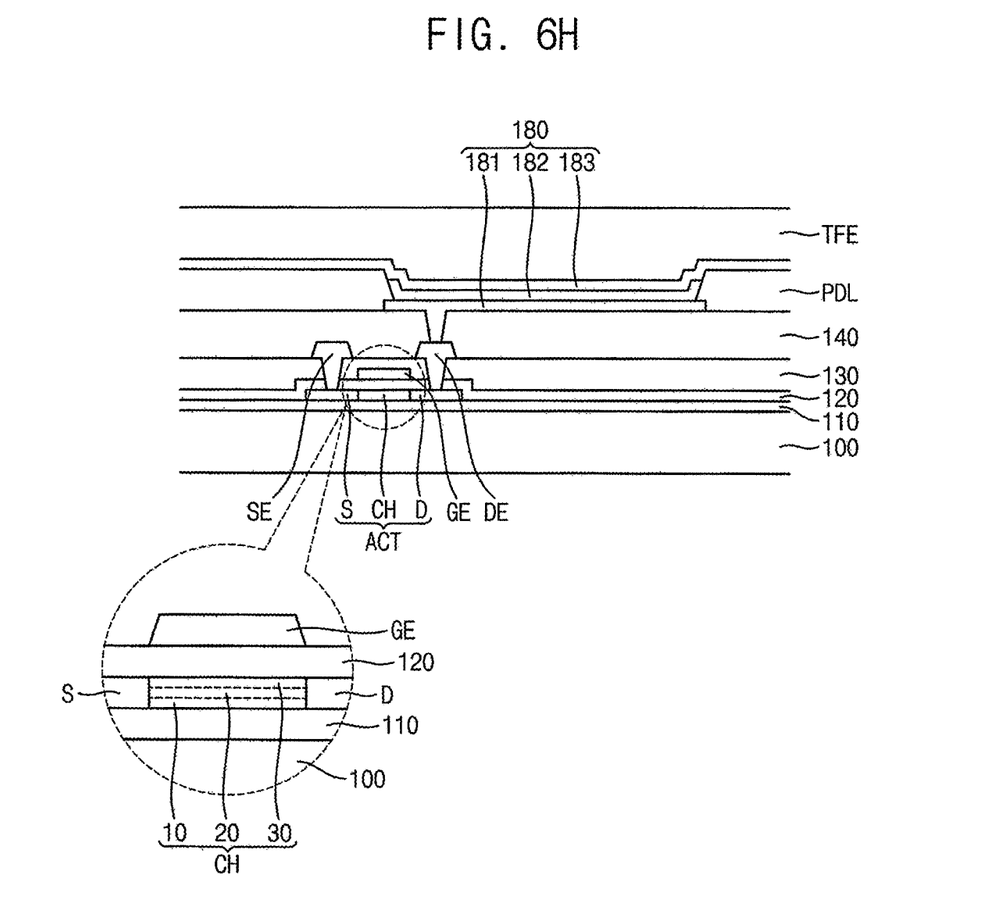

Referring to FIG. 6H, a via insulating layer 140 having a contact hole exposing the drain electrode DE may be formed on the interlayer insulating layer 130 on which the source and drain electrodes SE and DE are formed. A first electrode 181, a pixel defining layer PDL, a light emitting layer 182, and a second electrode 182 may be sequentially formed on the via insulating layer 140. A thin film encapsulation layer TFE may be formed on the second electrode 182. Thus, the display apparatus may be manufactured. A variety of suitable methods can be used as a method for forming each configuration of the display apparatus.

According to the present example embodiment, a display apparatus includes an active pattern including a doped channel region. The active pattern is formed by doping an amorphous silicon layer with impurities and then irradiating the doped amorphous silicon layer with an excimer laser, so that characteristics of a thin film transistor may be improved. Particularly, hysteresis of the thin film transistor may be reduced, thereby reducing a residual image problem and improving display quality. In addition, a dose amount of the channel region may be made smaller than that of a general thin film transistor, so that dispersion of the characteristics of the thin film transistor may be reduced by the small dose amount.

Figure 7:
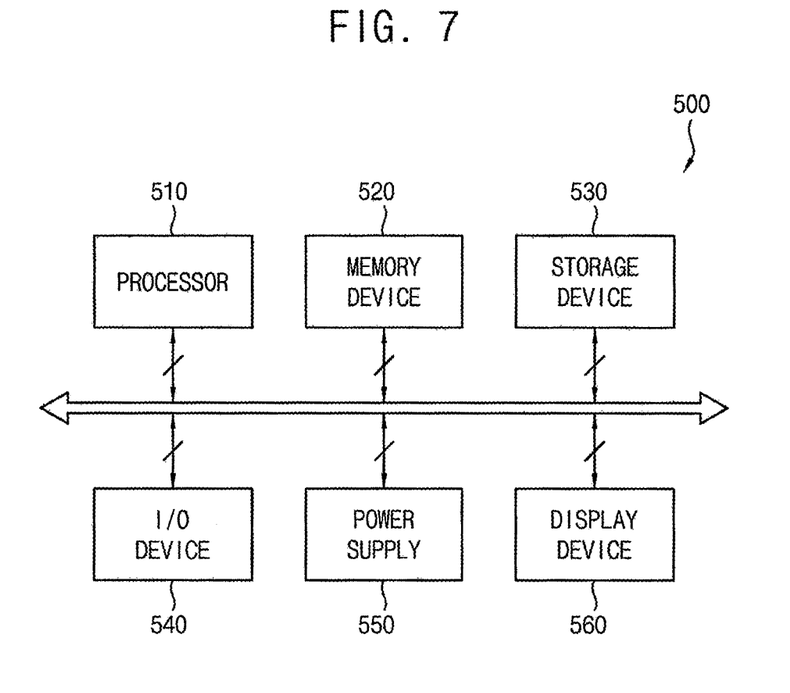
FIG. 7 illustrates a block diagram of an electronic device according to an example embodiment.
Figure 8A:
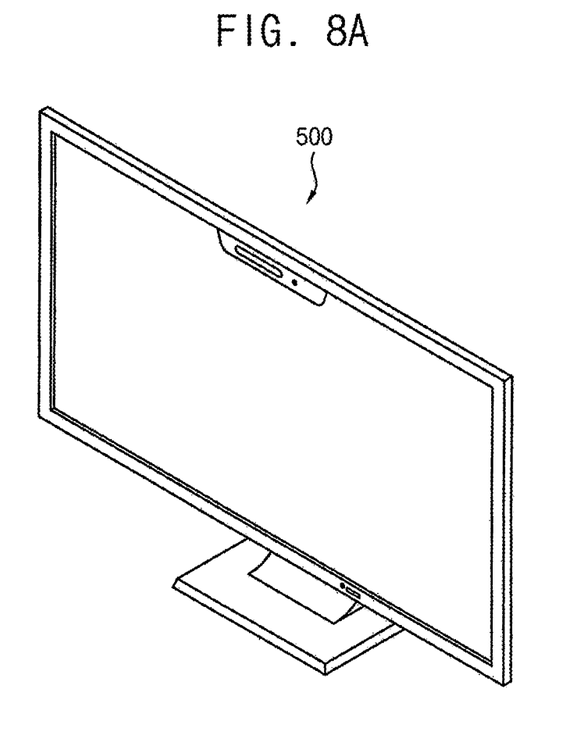
FIG. 8A illustrates a diagram of an example in which the electronic device of FIG. 7 is implemented as a television.
Figure 8B:
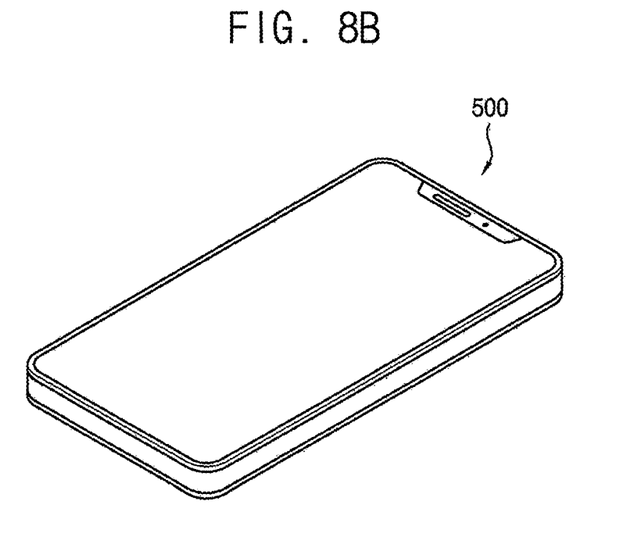
FIG. 8B illustrates a diagram of an example in which the electronic device of FIG. 7 is implemented as a smart phone.

FIG. 7 is a block diagram illustrating an electronic device according to an example embodiment. FIG. 8A is a diagram illustrating an example in which the electronic device of FIG. 7 is implemented as a television. FIG. 8B is a diagram illustrating an example in which the electronic device of FIG. 7 is implemented as a smart phone Referring to FIGS. 7 through 8B, the electronic device 500 may include a processor 510, a memory device 520, a storage device 530, an input/output (I/O) device 540, a power supply 550, and a display device 560. Here, the display device 560 may correspond to the display apparatus of FIG. 1. In addition, the electronic device 500 may further include a plurality of ports for communicating with a video card, a sound card, a memory card, a universal serial bus (USB) device, other electronic devices, etc. In an example embodiment, as illustrated in FIG. 8A, the electronic device 500 may be implemented as a television. In another example embodiment, as illustrated in FIG. 8B, the electronic device 500 may be implemented as a smart phone, for example. The electronic device 500 may also be implemented as a cellular phone, a video phone, a smart pad, a smart watch, a tablet PC, a car navigation system, a computer monitor, a laptop, a head mounted display (HMD), etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc. and an output device such as a printer, a speaker, etc. The power supply 550 may provide power for operations of the electronic device 500.

The display device 560 may be coupled to other components via the buses or other communication links. In an example embodiment, the display device 560 may be included in the I/O device 540. As described above, the display device 560 may include a thin film transistor having a reduced hysteresis and an improved driving range as a driving transistor. Thus, the display quality of the display device can be improved. However, since this has been described above, a description thereof will not be repeated.

Example embodiments may be applied to organic light emitting display devices and various electronic devices including the same. For example, example embodiments may be applied to a mobile phone, a smart phone, a video phone, a smart pad, a smart watch, a tablet PC, a car navigation system, a television, a computer monitor, a notebook, and the like.

By way of summation and review, a display apparatus may include a thin film transistor. The thin film transistor may include an active pattern including crystalline silicon, which may be crystallized amorphous silicon. To improve characteristics of the thin film transistor, an additional channel doping for the crystalline silicon has been previously considered. In an organic light emitting display apparatus, display quality may be influenced by the characteristics of a driving transistor.

As described above, example embodiments relate to a display apparatus and a method of manufacturing the display apparatus that may provide improved display quality.

In the claims, means-plus-function clauses are intended to cover the structures described herein as performing the recited function and not only structural equivalents but also equivalent structures.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of example embodiments as set forth in the following claims.

What is claimed is:

1. A display apparatus, comprising:
a base substrate;
an active pattern on the base substrate including a source region, a drain region, and a channel region that is doped between the source region and the drain region, the channel region including polycrystalline silicon; and
a gate electrode overlapping the channel region of the active pattern, wherein
the channel region includes a lower portion, an upper portion, and an intermediate portion that includes a center of the channel region, the intermediate portion between the upper portion and the lower portion, and
a dopant density of the center of the channel region and of the lower portion is 80% or more of a dopant density of the upper portion.

2. The display apparatus as claimed in claim 1, wherein: the upper portion is ⅓ thickness of the active pattern, and the lower portion is ⅓ thickness of the active pattern.

3. The display apparatus as claimed in claim 1, wherein a dopant of the channel region of the active pattern includes one or more of boron, phosphorus, nitrogen, nickel, or cobalt.

4. The display apparatus as claimed in claim 1, wherein an average grain size of the channel region of the active pattern is 270 nm or more.

5. The display apparatus as claimed in claim 1, wherein a fraction of (001) direction is 33% or more according to an Electron Back-Scattering Diffraction result of the channel region of the active pattern.

6. The display apparatus as claimed in claim 1, further comprising:
a gate insulating layer between the active pattern and the gate electrode;
an interlayer insulating layer on the gate electrode; and
source and drain electrodes on the interlayer insulating layer, and electrically connected to the active pattern.

7. The display apparatus as claimed in claim 6, further comprising:
a via insulating layer on the source and drain electrodes;
a first electrode on the via insulating layer, and electrically connected to the drain electrode;
a light emitting layer on the first electrode; and
a second electrode on the light emitting layer.

8. A method of manufacturing a display apparatus, the method comprising:
forming an amorphous silicon layer on a base substrate;
doping the amorphous silicon layer with impurities;
forming a polycrystalline silicon layer by irradiating the amorphous silicon layer, which is doped, with an excimer laser;
pattering the crystalline silicon layer; and
forming a source region and a drain region in the crystalline silicon layer to form an active pattern including the source region, the drain region, and a channel region between the source region and the drain region, wherein
the channel region includes a lower portion, an upper portion, and an intermediate portion that includes a center of the channel region, the intermediate portion between the upper portion and the lower portion, and
a dopant density of the center of the channel region and of the lower portion is 80% or more of a dopant density of the upper portion.

9. The method as claimed in claim 8, wherein, in doping the amorphous silicon layer, a dopant of the channel region of the active pattern includes one or more of boron, phosphorus, nitrogen, nickel, or cobalt.

10. The method as claimed in claim 9, wherein, in doping the amorphous silicon layer, a dose amount of the dopant is 0.4E12 to 1.5E12 at/cm².

11. The method as claimed in claim 9, wherein the crystalline silicon layer satisfies the following Equation 1:

$$Y=-0.075X+1.018 \text{ nm} \qquad \text{<Equation 1>}$$

where Y is a depth from an upper surface of the crystalline silicon layer at a max peak of the dopant amount, in nanometers, and X is laser density of the excimer laser in J/cm².

12. The method as claimed in claim 9, wherein, in forming the active pattern, the source region and the drain region of the crystalline silicon layer, which is doped, are further doped with impurities to increase conductivity of the source region and the drain region.

13. The method as claimed in claim 12, wherein a dose amount for forming the source region and the drain region in forming the active pattern is greater than a dose amount in the doping of the amorphous silicon layer.

14. The method as claimed in claim 8, wherein an average grain size of the channel region of the active pattern is 270 nm or more.

15. The method as claimed in claim 8, wherein a fraction of (001) direction is 33% or more according to an Electron Back-Scattering Diffraction result of the channel region of the active pattern.

16. The method as claimed in claim 8, further comprising:
forming a gate insulating layer on the crystalline silicon layer which is patterned after pattering the crystalline silicon layer; and
forming a gate electrode on the gate insulating layer,
wherein, in forming the active pattern, impurities are doped into the crystalline silicon layer where the gate electrode is disposed to form the source region and the drain region.

17. The method as claimed in claim 16, further comprising:
forming an intermediate insulating layer on the gate electrode;
forming a source electrode and a drain electrode electrically connected to the active pattern on the intermediate insulating layer;
forming a via insulating layer on the source electrode and the drain electrode;
forming a first electrode electrically connected to the drain electrode on the via insulating layer;
forming a light emitting layer on the first electrode; and
forming a second electrode on the light emitting layer.

18. The method as claimed in claim 8, further comprising performing heat treatment on the active pattern.

19. A display apparatus, comprising:
a base substrate;
an active pattern on the base substrate including a source region, a drain region, and a channel region that is doped between the source region and the drain region, the channel region including polycrystalline silicon; and
a gate electrode overlapping the channel region of the active pattern, wherein
the channel region includes a lower portion, an upper portion, and an intermediate portion that includes a center of the channel region, the intermediate portion between the upper portion and the lower portion, and a dopant density of the center of the channel region is 80% or more of a dopant density of the upper portion.

* * * * *